US006097179A

United States Patent [19]

Ray et al.

[11] Patent Number: 6,097,179

[45] Date of Patent: Aug. 1, 2000

[54] TEMPERATURE COMPENSATING COMPACT VOLTAGE REGULATOR FOR INTEGRATED CIRCUIT DEVICE

[75] Inventors: Abhijit Ray; Raghava Madhu, both of Bangalore Karnataka, India

[73] Assignee: Texas Instruments Incorporated, Dallas, Tex.

[21] Appl. No.: 09/264,092

[22] Filed: Mar. 8, 1999

[51] Int. Cl.[7] ................................ G05F 3/08; G05F 1/10; H03K 17/00

[52] U.S. Cl. ........................... 323/312; 323/273; 323/907

[58] Field of Search .................................... 323/312, 313, 323/273, 274, 907

[56] References Cited

U.S. PATENT DOCUMENTS

| | | | |
|---|---|---|---|
| 4,967,139 | 10/1990 | Betti et al. | 323/312 |
| 5,530,339 | 6/1996 | Macrae et al. | 323/312 |
| 5,801,582 | 9/1998 | Weber | 323/312 |

*Primary Examiner*—Peter S. Wong
*Assistant Examiner*—Bao Q. Vu
*Attorney, Agent, or Firm*—Robby T. Holland; Carlton H. Hoel; Frederick J. Telecky, Jr.

[57] ABSTRACT

A voltage regulator circuit (100), coupled between a high power supply voltage (VCC) and a lower power supply voltage (VSS), provides a regulated voltage (XDD) that is greater than the high power supply voltage (VCC). The voltage regulator circuit (100) includes a temperature compensating detect circuit (102) which activates a trigger signal when the XDD voltage exceeds a predetermined level. In response to an active trigger signal, a shunt circuit (104) couples the regulated voltage (XDD) to the high power supply voltage (VCC). The regulated voltage (XDD) is translated to the detect circuit (102) by the regulated voltage (XDD) being applied to the gate of a transistor (N112) disposed between the high power supply voltage (VCC) and a detect node (108). This arrangement allows monitoring of the regulated voltage (XDD) level without loading the regulated voltage (XDD).

23 Claims, 2 Drawing Sheets

TEMPERATURE COMPENSATING COMPACT VOLTAGE REGULATOR FOR INTEGRATED CIRCUIT DEVICE

TECHNICAL FIELD

The present invention relates generally to semiconductor integrated circuits, and more particularly to the circuits that regulate a non-supply voltage on an integrated circuit device.

BACKGROUND OF THE INVENTION

A continuing goal of integrated circuit manufacturers is that of compactness. As the physical size of integrated circuits is decreased, the fabrication of such devices can become more economical. One approach to increasing compactness is to take advantage of processing technology advances. Processing advances have led to generational reductions in minimum achievable feature sizes, and hence the existing size of designs can be "shrunk" to achieve smaller and smaller integrated circuit device sizes. While simple shrinks are effective in reducing the physical size of a device, such approaches are obviously limited by processing technology. Eventually, a minimum size will be achieved until the next processing advance comes into play. Furthermore, as another limitation, smaller feature sizes can require lower operating voltages, as the resulting smaller circuit devices may be incapable of functioning at certain power supply voltages.

Another goal of integrated circuit manufacturers is power reduction. The increasing prevalence of battery powered portable electronic devices has made lower power integrated circuits more desirable. Lower power components directly contribute to the amount of time a device can be operated before its batteries need to be replaced or recharged. The typical approach to reducing power consumption involves reducing the power supply voltage. In this way, generational shrinks can serve the goal of reducing power consumption.

While the use of lower power supply voltages can be implemented in logic circuits with relative ease, this is not necessarily true for more complex integrated circuits. For example, some integrated circuits require multiple supply voltages. Multiple supply voltages can be provided by the system in which the integrated circuit is used (e.g., a system with both a 3.3 volt bus and a 5 volt bus), such an approach is undesirable due to the added space and complexity of the system. A more efficient approach, when possible, is to generate the additional supply voltages on the integrated circuit itself. For example, many types of semiconductor memory devices include an array portion that is operated at a potential that is less than the power supply voltage. Alternatively, the array may be operated at the power supply voltage while the remaining "peripheral" circuits are operated at a potential that is greater than the power supply voltage. Further, in many programmable integrated circuits, such as electrically erasable programmable read-only-memories (EEPROMs), flash EPROMs, and programmable logic devices (PLDs), one or more additional supply voltages may be generated on the device to program and/or erase programmable devices within such integrated circuits. Such non-power supply voltages are typically larger than a high power supply voltage, or lower than a lower power supply voltage (are "outside the rails").

The use of non-power supply voltages on an integrated circuit can require special circuits. For example, the generation of outside the rail voltages is typically accomplished with a charge pump circuit. The charge pump circuit can be a single action circuit which "boots" a selected node with a single transfer of charge, or for the generation of larger magnitude voltages, a number of charge pump stages arranged in series. Each stage providing a progressively larger and larger magnitude voltage.

Another specialized circuit that is employed with non-power supply voltages results from irregularities in such voltages. In the case of non-power supply voltages, as the charge pump circuit "pumps" a node to a higher (or lower) voltage level, it may be necessary to prevent the resulting voltage from exceeding a particular value. As just one example, in the case of metal-oxide-semiconductor (MOS) transistors, the outside-the-rail voltage should be prevented from exceeding a source-drain breakdown voltage, or an oxide breakdown voltage. In addition, the stability of non-power supply voltages is desirable to ensure predictable operation of integrated circuit functions. EEPROM memory cells, for example, require predictable voltages to ensure proper programming and/or erasure of such cells. Consequently, where stability of a non-supply voltage is required, a voltage regulator circuit is provided.

Voltage regulators monitor the magnitude of a non-power supply voltage, and in the event the voltage varies from a reference level, an adjustment is made to bring the voltage back into the predetermined range. For example, in the case of a higher-than-supply voltage, a charge pump circuit may be activated that begins to charge a non-power supply node. In the event the non-power supply voltage exceeds a predetermined reference level, the voltage regulator circuit will begin discharging the non-power supply node to thereby maintain the node at the predetermined level. Typically, higher-than-supply voltages are coupled to the lower power supply voltage. In determining when to discharge a non-supply node, many voltage regulators use a compare operation. The non-supply voltage is continually compared with a reference voltage. When the reference voltage is exceeded, a discharge circuit is activated. Thus, the accuracy of a voltage regulator will usually depend upon the accuracy of its reference voltage.

Generating an accurate reference level can be problematic because of the nature of semiconductor circuit devices (e.g., transistors, resistors, etc.) and the environment in which integrated circuits operate. One particular problem has to do with temperature. As the operating temperature of an integrated circuit varies, the properties of the circuit devices vary.

A prior art way to address temperature related variations in a reference voltage has been to utilize a separate "band-gap" reference circuit to generate the reference voltage. The reference voltage would then be applied to the voltage regulator for the compare operation. Band-gap reference circuits take advantage of the fact that the base-emitter voltage (VBE) of a bipolar transistor has a negative temperature coefficient. That is, as the temperature increases, the VBE of a bipolar transistor will decrease. At the same time, the thermal voltage (VT) of the bipolar transistors, as well as resistor values, have positive temperature coefficients, and so can be used to compensate for drift in the VBE value. The output voltage at which a stable dc reference voltage can be maintained over considerable temperature variation turns out to be in the range of +1.25 volts. Band-gap reference circuits derive their name from this voltage, as it is close to the band-gap voltage of silicon.

While band-gap reference circuits can provide stable reference voltages, a drawback to such approaches is the additional complexity required to implement the circuits. As noted above, band-gap circuits typically require bipolar transistors. This can be problematic in the case of a MOS based integrated circuit, as an additional type of circuit device must be integrated into the fabrication process. In addition, band-gap circuits can require considerable area to implement, adding to the overall size of an integrated circuit.

Another important goal of integrated circuits is that of power supply voltage flexibility. Different electronic devices may have different power supply levels. It is therefore desirable that an integrated circuit be capable of providing the same functionality over a range of power supply voltages. Such a goal can be difficult to achieve if voltage regulator circuits are required, because the reference voltage utilized must not only be temperature independent, but also power supply independent as well. Complex band-gap reference circuits can be capable of providing such a reference voltage, but will have the drawbacks mentioned above.

In light of the increasing use of non-power supply voltages in integrated circuit devices, there is a need for a voltage regulator circuit that is compact, can compensate for temperature variations, but that does not require a mixture of circuit device types. In addition, there is also a need for a voltage regulator circuit that can operate over a range of power supply voltages.

SUMMARY OF THE INVENTION

According to the preferred embodiment, a voltage regulator is coupled between a high and a low power supply voltage, and regulates the magnitude of a non-power supply voltage. The preferred embodiment includes a temperature compensating detector circuit that receives power from the high power supply voltage and activates a trigger signal when the non-power supply voltage exceeds a predetermined value. When the trigger signal is activated, a shunt circuit couples the non-power supply voltage to the high power supply voltage, to thereby bring the regulated supply voltage into the desired range.

According to one aspect of the preferred embodiment, the detector circuit includes a reference circuit and a trigger circuit. The reference circuit provides a monitor voltage having a magnitude corresponding to the non-power supply voltage. The monitor voltage decreases as the operating temperature increases. The trigger circuit activates the trigger signal when the monitor voltage exceeds a trigger threshold level. The trigger threshold level also decreases as the temperature increases, compensating for changes in the monitor voltage.

DETAILED DESCRIPTION OF THE EMBODIMENTS

The preferred embodiment is a voltage regulator circuit, implemented with complementary metal(conductor)-oxide (insulator)-semiconductor (CMOS) technology, that is compact, and does not require a reference voltage from another circuit. The preferred embodiment provides consistent regulation of a non-power supply voltage over a range of power supply voltages and operating temperatures. In addition, no bipolar devices are required.

The preferred embodiment will be described in terms of a detailed schematic diagram. To assist in understanding the operation of the preferred embodiment, the schematic diagram has been conceptually divided into a number of functional blocks. This should not be construed as limiting the present, however. After the various functional blocks have been described, the overall operation of the preferred embodiment will be discussed. Finally, the operation of the preferred embodiment will be described by two graphs illustrating a DC response and transient response.

Figure 1:
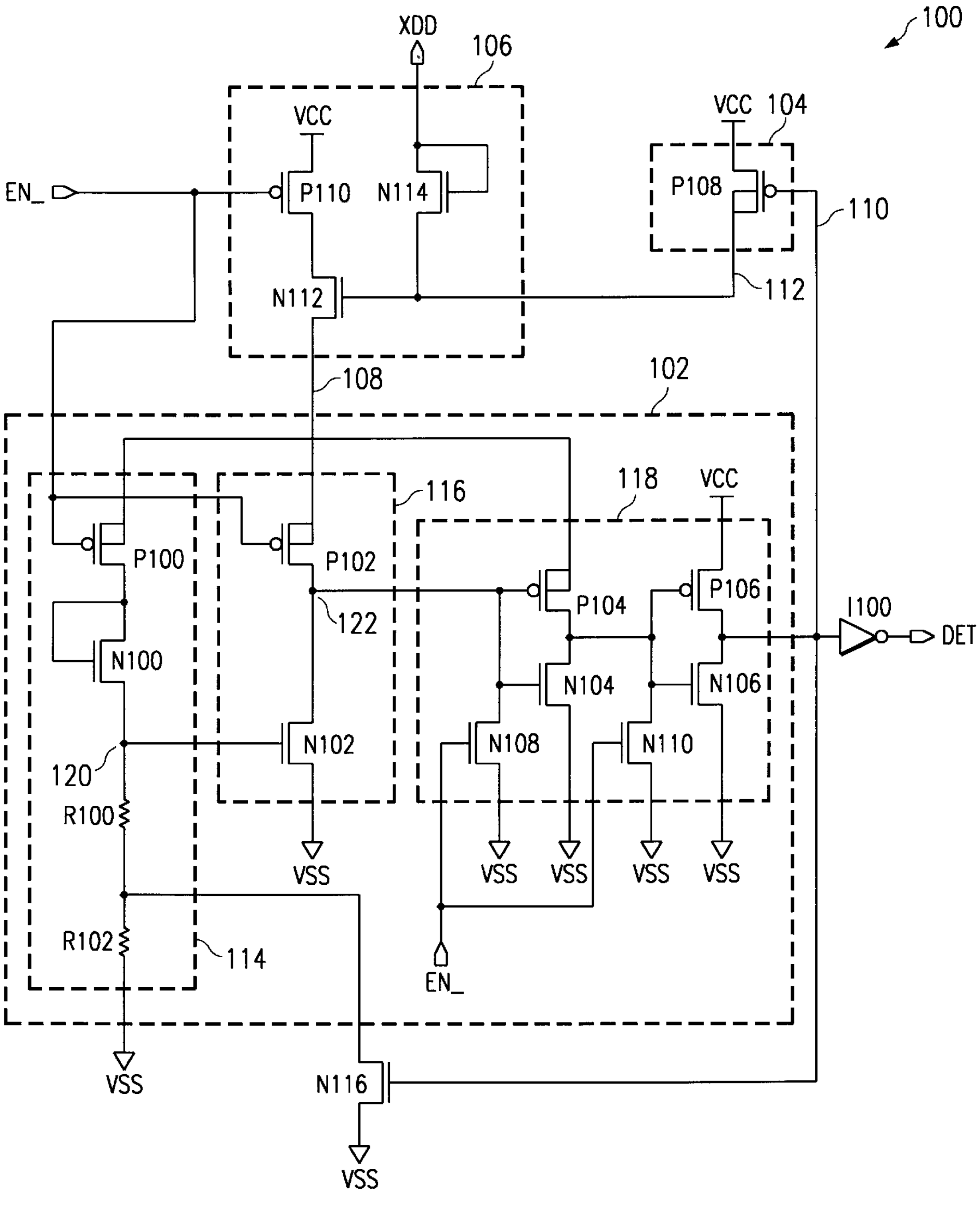
FIG. 1 is a schematic diagram of a preferred embodiment.

Referring now to FIG. 1, the preferred embodiment is set forth in a detailed schematic diagram. The preferred embodiment is designated by the general reference character 100 and shown to receive a high power supply voltage VCC and a low power supply voltage VSS. The regulated non-power supply voltage is shown as XDD. The non-supply voltage (XDD) is greater than the high power supply voltage VCC. The preferred embodiment 100 also receives an enable signal EN_ that enables the voltage regulator when active (low). Conversely, when EN_ is high, the preferred embodiment 100 is disabled. Finally, the preferred embodiment 100 is shown to generate a detect signal DET. The detect signal is active (high) when the XDD voltage exceeds a predetermined regulated level.

The preferred embodiment is designated by the general reference character 100, and can be conceptualized as including a detect circuit 102, a shunt circuit 104, and a supply circuit 106. The detect circuit 102 is coupled to a detect node 108 that carries a voltage reflective of the magnitude of the XDD voltage. The voltage of the detect node 108 is used by the detect circuit 102 to determine when the XDD voltage is out of a particular range. As the XDD voltage goes out of range, the detect circuit 102 will drive a detect signal node 110 between the VCC voltage and the VSS voltage level. The potential at the detect signal node 110 is inverted by an output inverter I100, to generate the DET signal. In the preferred embodiment 100, inverter I100 is a CMOS inverter having a p-channel MOS transistor with a width-to-length ratio (W/L) of 30/0.9 and an n-channel MOS transistor with a W/L of 15/0.9.

The shunt circuit 104 is coupled between a regulated node 112 and the high power supply voltage VCC. The operation of the shunt circuit 104 is controlled by the potential at the detect signal node 110. When the detect signal node 110 indicates that the XDD voltage has exceeded its predetermined range (is active low), the shunt circuit 104 will provide a low impedance path between the regulated node 112 and the VCC voltage. When the detect signal node 110 indicates that the XDD voltage is inactive (high), the shunt circuit 104 functions like a "diode device," providing a low impedance path between the regulated node 112 and the VCC voltage, only when the potential between the regulated node 112 and the VCC voltage exceeds a specific voltage drop. The shunt circuit 104 regulates the XDD voltage by channeling off charge from the XDD supply voltage to the high power supply voltage VCC. It is noted that this differs from other voltage regulator approaches which channel excess charge to the low power supply voltage VSS. The preferred embodiment 100, by "discharging" the non-supply voltage XDD to the high power supply voltage VCC, consumes less power.

The supply circuit 106 of the preferred embodiment 100 receives the XDD voltage, and in response to the magnitude of the XDD voltage, varies the potential at the detect node 108. Unlike some prior art voltage regulator circuits, the regulated voltage (XDD) is not coupled directly to the detect circuit 102, but instead, is used to control an impedance path between the high power supply voltage VCC and the detect node 108. This arrangement is advantageous, as the monitoring operation of the XDD voltage will load the XDD supply voltage itself. This helps to maintain the XDD voltage level. The supply circuit 106 also couples the XDD voltage to the regulated node 112, and, as will be described below, regulates the XDD voltage from the regulated node 112.

Referring once again to FIG. 1, the detect circuit 102 is shown to include a reference circuit 114, a trigger circuit 116, and a driver circuit 118. The reference circuit 114 is situated between the detect node 108 and the low power supply voltage VSS. The reference circuit 114 functions as a voltage divider, dividing the potential between the detect node 108 and the VSS voltage through a series of divider elements. In the particular arrangement of FIG. 1, the reference circuit 114 includes an n-channel MOS transistor N100 arranged in a diode configuration (i.e., its drain coupled to its gate) situated in series with a reference impedance device, formed by two resistors, R100 and R102. In addition, a reference supply transistor P100 is included. Transistor P100 has a source-drain path coupled between the detect node 108 and the drain/gate of transistor N100. The gate of transistor P100 is coupled to the EN_ signal.

The junction formed where the source of transistor N100 is coupled to resistor R100 forms a monitor node 120. When a potential (that is reflective of the XDD voltage level) is applied at the detect node 108, provided transistor P100 is turned on (EN_ is low), the voltage divider action of transistor N100 and resistors R100 and R102 results in a monitor voltage being generated at the monitor node 120. Because the detect node 108 voltage reflects the XDD voltage, and the monitor voltage reflects the detect node voltage 108, the monitor voltage will reflect the XDD voltage.

While the reference circuit 102 provides a voltage at the monitor node 120 that reflects the XDD voltage, this voltage will vary as the temperature varies. In particular, given a constant potential at the detect node 108, the monitor voltage will decrease as the temperature increases, and increase as the temperature decreases. The monitor voltage provided by the reference circuit can thus be considered to have a “negative” temperature coefficient. It is understood that the term negative coefficient not meant to imply that there is necessarily a linear relationship between the temperature and the monitor voltage, and is only intended to indicate that the monitor voltage decreases as the temperature increases.

In the preferred embodiment 100, transistors P100 and N100 have W/Ls of 3/5 and 10/0.8, respectively. Resistors R100 and R102 have resistances of 40 kohms and 5 kohms, respectively. Transistor P100 has its body connected to its source.

The trigger circuit 116 of the preferred embodiment 100 is shown to include an n-channel MOS trigger transistor N102 coupled in series with a p-channel MOS trigger supply transistor P102 between the detect node 108 and the VSS voltage. The drain-drain junction of transistors P102 and N102 forms a trigger node 122. The gate of transistor N102 is coupled to the monitor node 120. The gate of transistor P102 receives the EN_ signal. Thus, provided the EN_ signal is active (low), the trigger circuit 116 functions roughly as an inverter, inverting the potential at the monitor node 120 to provide a trigger signal at the trigger node 122. Transistor P102 is a relatively small device that will act as a constant pull-up device, driving the trigger node 122 high when transistor N102 is off. When transistor N102 is on, it will overpower transistor P102, pulling the trigger node 122 to VSS. In the preferred embodiment 100, transistors P102 and N102 have W/Ls of 3/10 and 20/0.8, respectively. Transistor P102, like transistor P100, has its body connected to its source.

The trigger circuit 116 drives the trigger node 122 according to the potential at the monitor node 120, to thereby provide a trigger signal that is activated in response to the XDD voltage exceeding a predetermined threshold voltage. It is noted that the trigger circuit 116 is designed to counter the effects of temperature on the reference circuit 114. As a result, the reference circuit 114 in combination with the trigger node 122 will provide a trigger signal having a response that is resistant to variations in operating temperature. The trigger node 122 compensates for the negative temperature coefficient aspect of the monitor voltage by driving the trigger node 122 with transistor N102. Like the monitor voltage, the threshold voltage (Vtn) of transistor N102 decreases as the temperature increases. The Vtn can thus be considered to have a negative temperature coefficient. as well. In this manner, as variations in temperature result in changes in the monitor voltage, the threshold voltage of transistor N102 changes in a similar fashion.

The operation of the reference circuit 114 in conjunction with the trigger circuit 116 may be best understood by an example. For example, at a first temperature, a given potential at the detect node 108 will result in the monitor voltage equaling the Vtn of transistor N102. Transistor N102 will then turn on, and the trigger node 122 will be pulled to VSS. At a second temperature, higher than the first temperature, the same detect node potential 108 will result in a lower monitor voltage. However, the same increase in temperature results in the Vtn having a smaller value, and transistor N102 will be turned on in response to the lower monitor voltage. Thus, despite variations in operating temperature, the same general detect node potential 108 will result in the activation of the trigger signal.

By using the self-compensating temperature response of the reference circuit 114 and the trigger circuit 116, the preferred embodiment 100 does not require a separate circuit, such as a band-gap reference circuit, to provide a comparison reference voltage. Consequently, an integrated circuit may be made more compact and/or additional area is available for other purposes.

The driver circuit 118 essentially serves as a waveshaping circuit to provide a trigger signal with sharper edges. The driver circuit 118 of the preferred embodiment 100 is shown to include a first CMOS driver inverter formed by p-channel MOS transistor P104 and n-channel MOS transistor N104. The high output voltage of inverter P104/N104 is provided by the detect node 108. The low output voltage of inverter P104/N104 is the VSS voltage. The output of the first driver inverter P104/N104 is connected to the input of a second CMOS driver inverter. The second CMOS driver inverter is formed by a p-channel MOS transistor P106 arranged in series with an n-channel MOS transistor N106. The output of the second driver inverter P106/N106 is the detect signal node 110. Unlike the first driver inverter P104/N104, the second driver inverter P106/N106 drives its output between the high power supply voltage (as opposed to the potential of the detect node 108) and the low power supply voltage VSS.

The driver circuit 118 is shown to further include first and second disable transistors N108 and N110 associated with the first and second driver inverters P104/N104 and P106/N106, respectively. Transistor N108 has a source-drain path coupled between the common gates of transistors P104/N104 and the VSS voltage. Transistor N110 has a source-drain path coupled between the common gates of transistors P106/N106 and the VSS voltage. The gates of transistors N108 and N110 are both coupled to the EN_ signal. Thus, when the EN_ signal is high (inactive), transistors N108 and N110 are turned on, turning off transistors N108 and N110 within the inverters. In this manner, a high EN_ signal disabled the current paths of the first and second driver inverters (P104/N104 and P106/N106).

In the preferred embodiment 100, the transistors P104 and N104 have W/Ls of 10/50 and 10/0.8, respectively. Transistor P104 has its body connected to its source. Transistors P106 and N106 have W/Ls of 10/10 and 10/0.8, respectively. Transistors N108 and N110 are of the same size, having W/Ls of 3/2.

The shunt circuit 104 of the particular embodiment of FIG. 1 is shown to include a p-channel MOS shunt transistor having a source-drain path coupled between the regulated node 112 and the VCC power supply. The gate of transistor P108 is coupled to the detect signal node 110. The body of transistor P108 is also coupled to the regulated node 112. When the trigger signal is active (low), the detect signal node 110 is driven to VSS. Provided there is a sufficient potential between the source and drain of transistor P108, transistor P108 will provide a low impedance path between the regulated node 112 and the VCC voltage. In contrast, when the trigger signal is inactive (high) the gate of transistor P108 is driven to the VCC voltage. Transistor P108 will then be arranged in a diode configuration, and provide a conductive path only when the potential between its source and drain/gate exceed the threshold voltage of the transistor. Transistor P108 has a W/L of 10/1.2.

The supply circuit 106 is shown to include a p-channel MOS supply enable transistor P110 arranged in series with an n-channel MOS supply transistor N112 between the high power supply voltage VCC and the detect node 108. When the EN_ signal is active (LOW), transistor P110 is turned on, providing power to the supply transistor N112. It is noted that the supply enable transistor P110 and supply transistor N112 provide power from the VCC power supply to the reference circuit 114, the trigger circuit 116, and the first driver inverter P104/N104. In addition, the second driver inverter P106/N106 receives power directly from the VCC power supply. As noted above, this arrangement allows the potential of the XDD voltage to be monitored without draining current from the XDD supply voltage. In the preferred embodiment 100, transistors P110, N112 and N114 have W/Ls of 20/0.8, 30/1.2, and 250/1.2.

Referring yet again to FIG. 1, the preferred embodiment 100 is shown to further include a device for introducing hysteresis into the response of the voltage regulator. The hysteresis device of the particular embodiment of FIG. 1 is shown to include an n-channel transistor N116 having a source-drain path coupled between the junction of resistors R100 and R102 and the VSS voltage. The gate of transistor N116 is connected to the detect signal node 110. In this arrangement, when the detect signal node 110 is low, transistor N116 is turned off. When the detect signal node 110 is high, transistor N116 will be turned on, essentially removing resistor R102 from the voltage divider action, thereby raising the voltage necessary to cause the trigger circuit 116 to drive the trigger node 122 low. In the preferred embodiment 100, transistor N112 has a W/L of 20/0.8.

Having set forth the general arrangement of the preferred embodiment 100, the operation of the preferred embodiment 100 will now be described. The operation of the preferred embodiment 100 depends upon a detect voltage level (Vdet) established by the detector circuit 102 components and the threshold voltage of transistor N112 (Vtnd). The detect voltage level (Vdet) is the voltage at the detect node 108 that is necessary to cause the trigger circuit 116 to activate the trigger signal (drive the trigger node 122 low).

In the event the detect voltage (Vdet) plus the threshold voltage (Vtnd) is less than the VCC voltage (VCC>Vdet+Vtnd), when the XDD voltage is pumped high (by charge pump circuits or the like), the detect node 108 will be raised above the Vdet level. Within the reference circuit 114, the voltage divider action will raise the monitor node 120 above the threshold voltage of transistor N102, and the trigger circuit 116 will drive the trigger node 122 low. The trigger node 122 level will be buffered by the drive circuit 118 and drive the detect signal node 110 to VSS. With the detect signal node 110 at VSS, transistor P108 is turned on, coupling the regulated node 112 to the VCC voltage. This coupling, in conjunction with the diode connected transistor N114, results in the XDD voltage being clamped to VCC+Vtnd.

In the event the detect voltage (Vdet) is greater than the VCC voltage (VCC<Vdet) when the XDD voltage is pumped high, transistor N112 is turned on. However, because Vdet is greater than VCC, the detect node 108 cannot be raised above Vdet. Consequently, the voltage of the monitor node 120 within the reference circuit 114 cannot be raised above the Vtn of trigger transistors N102, and the constant pull-up action of transistor P102 will pull the trigger node 122 high. The high level of the trigger node 122 is buffered by the drive circuit 118 resulting in the detect signal node 110 being driven to VCC. With the detect signal node 110 at VCC, transistor P108 functions as a diode device. The resulting arrangement clamps the XDD voltage at a level equal to VCC+Vtnd+Vtp (where Vtp is the threshold voltage of transistor P108). The VCC level at the detect signal node 110 also results in hysteresis transistor N1 16 being turned on. Resistor R102 is bypassed, and the effective Vdet threshold voltage is raised.

A third operating range for the preferred embodiment 100 occurs when the VCC voltage is greater than the detect voltage level (Vdet), but less than the detect voltage level (Vdet) plus the threshold voltage of transistor N112 (Vtnd) (Vdet+Vtnd>VCC>Vdet). In this operating range, as XDD varies, the detect node 108 will either exceed the Vdet level clamping XDD at VCC+Vtnd, or fall below Vdet, and clamp XDD at VCC+Vtnd+Vtp and enable hysteresis transistor N116. In this manner, the XDD voltage will be clamped between VCC+Vtnd+Vtp and VCC+Vtnd.

In this manner, according to the high power supply voltage VCC, the XDD voltage is clamped with respect to VCC (i.e., at either VCC+Vtnd or VCC+Vtnd+Vtp). This is in contrast to other conventional clamping arrangements, which would clamp a higher-than-supply voltage (such as XDD) with respect to the VSS voltage. Such conventional arrangements typically include a large number of clamping devices (such as diode connected transistors) between the XDD voltage and VSS voltage. This arrangement can suffer in performance due to temperature effects on the transistors, leading to unacceptable variations in the resulting clamped XDD value.

Figure 2:
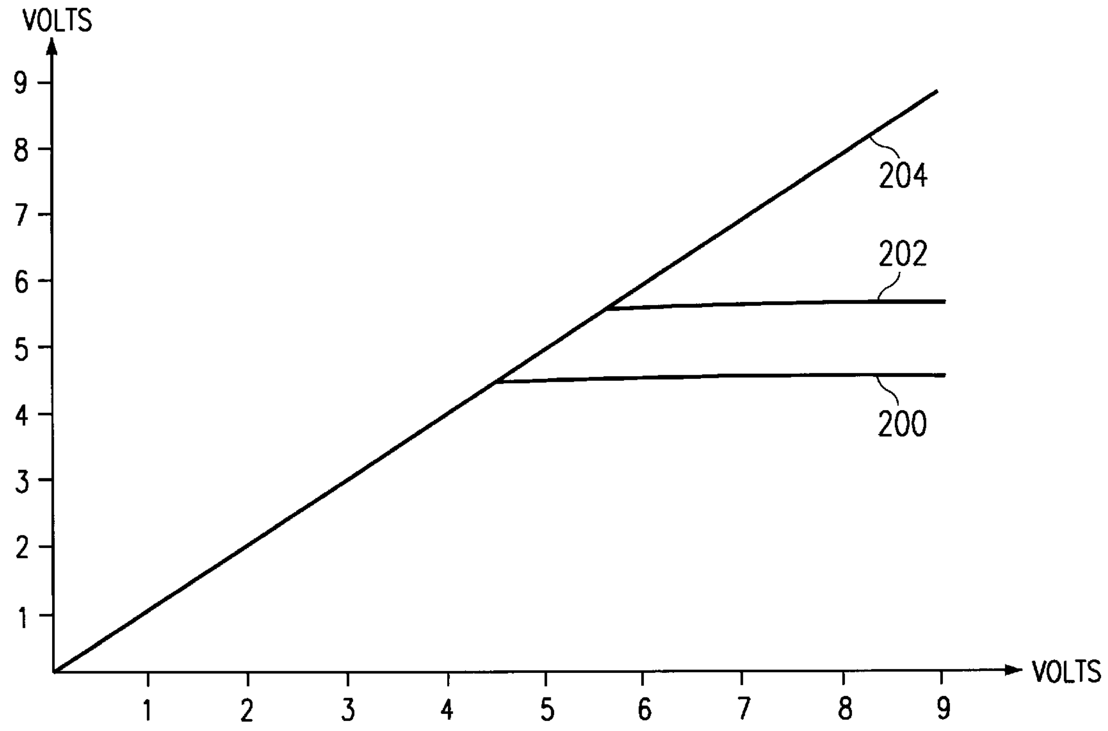
FIG. 2 is a graph illustrating a DC response of the preferred embodiment.

Referring now to FIG. 2, a DC analysis of the particular embodiment of FIG. 1 is set forth in a graph. The graph sets forth a circuit simulation response of the preferred embodiment 100 to variations in temperature (−45° C., 27° C. and 90° C.), variations in operating voltage (2.7V and 3.6V), and process variations (simulated by "weak" transistor models and "strong" transistor models).

In FIG. 2, both the X-axis and Y-axis include a voltage scale. From the various permutations of temperature, operating voltage, and transistor models, the resulting lowest clamping response 200 and highest clamping response 202 have been included. In addition, an "clamp disabled" response 204 is set forth. The clamp disabled response 204 illustrates the resulting XDD voltage when the preferred embodiment is disabled (for example, when EN_ is high). As illustrated by FIG. 2, beginning at about 4.6 volts, the voltage regulator will begin a clamping action (except in the clamp disabled response 204). The particular magnitude of the clamping level depending upon the various permutations (temperature, operating voltage, device model) described above. The lowest clamping response 200, results from a 90° C. operating temperature, a supply voltage of 2.7, and strong transistor models, is at about 4.6 volts. The highest clamping response, resulting from a −45° C. operating temperature, a supply voltage of 3.6, and weak transistor models, is at about 5.7 volts. The remaining permutations of operating voltage, temperature, and device model result in clamped voltages having levels between those of response 200 and 202. It is noted that both the lowest clamping response 200 and the highest clamping response 202 illustrate cases in which the XDD voltage level is clamped at VCC+Vtnd+Vtp.

Figure 3:
FIG. 3 is a graph illustrating transient response of the preferred embodiment.

Referring now to FIG. 3, a transient analysis of the particular embodiment of FIG. 1 is set forth in another graph. The graph sets forth circuit simulation response of the preferred embodiment to the same variations in temperature (−45° C., 27° C. and 90° C.), operating voltage (2.7V and 3.6V), and process ("weak" models and "strong" models) as FIG. 2. The Y-axis illustrates voltage while the X-axis represents time. FIG. 3 includes a resulting lowest clamping response 300 and a highest clamping response 302. A clamp disabled response is also set forth, illustrated by waveform 304. The supplied voltage ramps from 0V to about 9V between 0 $\mu$s and 250 $\mu$s, and then ramps back down to 0V between 250 $\mu$s and 500 $\mu$s.

In a similar fashion to the DC response, beginning at about 4.6 volts, the voltage regulator clamping action comes into effect. The lowest and highest levels (300 and 302) follow those of FIG. 3, with the lowest level 300 being about 4.6 V and corresponding to a 90° C. operating temperature, a supply voltage of 2.7, and strong transistor models. The highest level is about 5.7V and corresponds to a −45° C. operating temperature, a supply voltage of 3.6, and weak transistor models. The remaining permutations of operating voltage, temperature, and device model, all give responses that fall between those of response 300 and 302.

It is understood that while the preferred embodiment has been discussed in terms of a preferred CMOS embodiment, the teachings set forth herein, could be employed in other technologies to derive some of the same advantages. Thus, it is understood that while the present invention has been described in terms of a detailed preferred embodiment, various changes, substitutions, and alterations could be made without departing from the spirit and scope of the invention. Accordingly, the present invention is intended to be limited only as defined by the appended claims.

What is claimed is:

1. A voltage regulation circuit, comprising:

a regulated voltage node;

a detect node;

a supply circuit coupled between a first power supply and the detect node, the supply circuit coupling the detect node to the first power supply according to the potential of the regulated voltage node;

a detector circuit coupled between the detect node and a second power supply, the detector circuit including a reference circuit that generates a monitor voltage at a monitor node, the monitor voltage having a magnitude that varies as the operating temperature of the voltage regulation circuit varies, and a trigger circuit coupled to the reference circuit that activates a trigger signal when the monitor voltage exceeds a threshold level, the threshold level varying in response to operating temperature variations in a fashion that corresponds to the monitor voltage variations to temperature; and a shunt circuit coupled between the regulated voltage node and the first power supply node, the shunt circuit providing a low impedance path between regulated voltage node and the first power supply node when the trigger signal is activated.

2. The voltage regulation circuit of claim 1, wherein:

the first power supply is a high power supply voltage;

the second power supply is a low power supply voltage; and the regulated power supply voltage node is coupled to a regulated power supply voltage that is greater than the high power supply voltage.

3. The voltage regulation circuit of claim 1, wherein:

the detector circuit includes the monitor voltage of the reference circuit decreasing as the operating temperature increases, and increasing as the operating temperature decreases, and a detector voltage level of the trigger circuit decreasing as the operating temperature increases, and increasing as the operating temperature decreases.

4. The voltage regulation circuit of claim 1, wherein:

the detector circuit further includes the trigger circuit generating the trigger signal at a trigger output node, and a first inverter having an input coupled to the trigger output node and an output coupled to the shunt circuit, the first inverter driving its output between the first power supply and the second power node.

5. The voltage regulation circuit of claim 4, wherein:

the first inverter further includes a drive disable circuit that receives a disable signal and couples the input of the first inverter to one of the power supply voltage.

6. The voltage regulation circuit of claim 1, wherein:

the shunt circuit includes a shunt IGFET having a source-drain path coupled between the regulated voltage node and the first power supply node, the gate of the shunt IGFET being coupled to the trigger signal.

7. The voltage regulation circuit of claim 1, wherein:

the supply circuit includes a supply IGFET having source-drain path coupled between the first power supply node and the detect node, the gate of the supply IFGET being coupled to the regulated voltage node.

8. The voltage regulation circuit of claim 7, wherein:

the supply circuit further includes a supply disable IGFET having source-drain path coupled between the supply IGFET and the first power supply node, the gate of the first supply IGFET being coupled to an enable signal.

9. The voltage regulation circuit of claim 1, wherein:

the regulated voltage node is coupled to a regulated power supply voltage by a diode device.

10. The voltage regulation circuit of claim 1, wherein:

the diode device is a diode connected IGFET.

11. In an integrated circuit device that receives a power supply voltage and generates a regulated voltage that is greater in magnitude than the power supply voltage, a voltage regulator circuit, comprising:

a first diode device coupled between the regulated voltage and a regulated node;

a shunt circuit that receives a trigger signal, the shunt circuit including a shunt path coupled between the regulated node and the power supply voltage, the shunt path being a low impedance path when the trigger signal is active and being a second diode device when the trigger signal is inactive; and a detector circuit that receives power from the power supply voltage, the detector circuit having a detect node and providing the trigger signal as an output, the detector circuit activating the trigger signal when the potential at the detect node exceeds a predetermined range, and the trigger signal being inactive when the potential at the detect node is within the predetermined range.

12. The voltage regulator circuit of claim 11, wherein:

the first diode device includes an insulated gate field effect transistor (IGFET) having its gate coupled to its drain.

13. The voltage regulator circuit of claim 11, wherein:

the shunt circuit includes an IGFET having a source-drain path coupled between the regulated node and the power supply voltage.

14. The voltage regulator circuit of claim 13, wherein:

the gate of the IGFET is driven to the power supply voltage when the trigger signal is inactive.

15. The voltage regulator circuit of claim 11, wherein:

the detector circuit includes a reference circuit that provides a reference voltage having a temperature coefficient of a predetermined polarity, and a trigger circuit that activates the trigger signal in response to the reference voltage being greater than reference level, the magnitude of the reference level having a temperature coefficient of the predetermined polarity.

16. The voltage regulator circuit of claim 15, further including:

a supply circuit having a controllable impedance path coupled between the detector circuit and the high power supply voltage, the controllable impedance path having a impedance that varies in response to the potential at the regulated node.

17. The voltage regulator circuit of claim 15, wherein:

the detector circuit further includes an inverter having an input coupled to the trigger circuit and an output that provides the trigger signal, the inverter driving the trigger signal between the power supply voltage and a low voltage.

18. In a semiconductor integrated circuit that receive a first power supply voltage and a second power supply voltage, a compact voltage regulator circuit, comprising:

a detect node;

a reference circuit coupled between the detect node and the second power supply voltage, the reference circuit including a reference impedance coupled between a monitor node and the second power supply voltage;

a trigger circuit coupled between the detect node and the second power supply voltage, the trigger circuit including a trigger insulated gate field effect transistor having a gate coupled to the monitor node and a source-drain path coupled between a trigger output node and the second power supply voltage;

a shunt IGFET having a gate coupled to the trigger output node and a source-drain path coupled between the first power supply voltage and a regulated node; and a supply IGFET having a gate coupled to the regulated node and a source-drain path coupled between the first power supply voltage and the detect node.

19. The compact voltage regulator circuit of claim 18, further including:

the reference impedance includes a first reference impedance device in series with a second reference impedance device; and a hysteresis IGFET having a gate coupled to the trigger output node and a source-drain path coupled in parallel with the second reference impedance device.

20. The compact voltage regulator circuit of claim 18, wherein:

the trigger output node is coupled to the gate of the hysteresis IGFET by at least one inverter.

21. The compact voltage regulator circuit of claim 18, wherein:

the reference circuit further includes a reference IGFET having a source-drain path coupled between the detect node and the monitor node.

22. The compact voltage regulator circuit of claim 18, wherein:

the trigger circuit further includes a current supply IGFET having a source-drain path coupled between the detect node and the trigger output node, the gate of the current supply IGFET being coupled to an enabling voltage which enables the IGFET when the compact voltage regulator circuit is enabled.

23. The compact voltage regulator circuit of claim 18, including:

the regulated node is coupled to a regulated voltage by a coupling IGFET that introduces a potential drop between the regulated voltage and the regulated node.

* * * * *